United States Patent
Bernstein et al.

[11] Patent Number: 5,226,418
[45] Date of Patent: Jul. 13, 1993

[54] PHASE CORRECTION OF COMPLEX - DIFFERENCE PROCESSED MAGNETIC RESONANCE ANGIOGRAMS

[75] Inventors: Matthew A. Bernstein, Waukesha, Wis.; Norbert J. Pelc, Los Altos, Calif.

[73] Assignee: General Electric Company, Milwaukee, Wis.

[21] Appl. No.: 738,765

[22] Filed: Aug. 1, 1991

[51] Int. Cl.$^5$ ................ A61B 5/055; G01R 33/20
[52] U.S. Cl. ...................... 128/653.3; 324/306; 324/309
[58] Field of Search .............. 128/653.2–653.5; 324/306–309, 312, 318, 321

[56] References Cited

U.S. PATENT DOCUMENTS

| | | | |
|---|---|---|---|
| 4,609,872 | 9/1986 | O'Donnell | 324/306 |
| 4,714,081 | 12/1987 | Dumoulin et al. | 128/653 |
| 4,870,361 | 9/1989 | In den Kleef et al. | 324/307 X |
| 4,937,526 | 6/1990 | Ehman et al. | 324/309 |
| 4,954,779 | 9/1990 | Zur | 128/653.3 X |
| 4,968,935 | 11/1990 | Ehman et al. | 324/306 X |
| 5,113,865 | 5/1992 | Maeda et al. | 128/653.2 |

FOREIGN PATENT DOCUMENTS 0301629 1/1989 Netherlands.

OTHER PUBLICATIONS

Dumoulin, Souza, Walker & Wagle, "Three-Dimensional Phase Contrast Angiography", (1989), pp. 139–149.

C. B. Ahn & Z. H. Cho, "A New Phase Correction Method in NMR Imaging Based on Autocorrelation and Histogram Analysis", (Mar. 1987), pp. 32 & 36.

Bernstein, Thomasson & William, "Improved Detectability in Low Signal-to Noise Ratio Magnetic Resonance Images by Means of a Phase-Corrected Real Reconstruction", (Jul. 1989), pp. 813–817.

Primary Examiner—Francis Jaworski
Attorney, Agent, or Firm—Quarles & Brady

[57] ABSTRACT

An NMR system produces an angiogram using the complex-difference method. Artifacts caused by system phase errors are reduced by calculating a corrected phase angle using the acquired NMR data sets and using the corrected phase angle in calculating the complex difference in the corresponding elements of the image domain NMR data sets.

2 Claims, 4 Drawing Sheets

PHASE CORRECTION OF COMPLEX - DIFFERENCE PROCESSED MAGNETIC RESONANCE ANGIOGRAMS

BACKGROUND OF THE INVENTION

The field of the invention is nuclear magnetic resonance imaging methods and systems. More particularly, the invention relates to magnetic resonance angiograms which are produced using complex differences between image data sets acquired with different values of gradient field first moments.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The degree to which the net magnetic moment $M_z$ is tipped (flip angle), and hence the magnitude of the net transverse magnetic moment $M_t$ depends primarily on the length of time and the magnitude of the applied excitation field $B_1$.

The practical value of this phenomenon resides in the signal which is emitted by the excited spins after the excitation signal $B_1$ is terminated. In simple systems the excited spin induces an oscillating sine wave signal in a receiving coil. The frequency of this signal is the Larmor frequency, and its initial amplitude, $A_0$, is determined by the magnitude of the transverse magnetic moment $M_t$ and the flip angle. The amplitude, A, of the emission signal decays in an exponential fashion with time, t:

$$A = A_0 e^{-t/T^*_2}$$

The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the excitation signal $B_1$ in a perfectly homogeneous field.

Another important factor which contributes to the amplitude A of the NMR signal is referred to as the spin-lattice relaxation process which is characterized by the time constant $T_1$. It describes the recovery of the net magnetic moment M to its equilibrium value along the axis of magnetic polarization (z). The $T_1$ time constant is longer than $T_2$, much longer in most substances of medical interest.

The NMR measurements of particular relevance to the present invention are called "pulsed NMR measurements". Such NMR measurements are divided into a period of RF excitation and a period of signal emission. Such measurements are performed in a cyclic manner in which the NMR measurement is repeated many times to accumulate different data during each cycle or to make the same measurement at different locations in the subject. A wide variety of preparative excitation techniques are known which involve the application of one or more RF excitation pulses ($B_1$) of varying magnitude, duration, and direction. Such excitation pulses may have a narrow frequency spectrum (selective excitation pulse), or they may have a broad frequency spectrum (nonselective excitation pulse) which produces transverse magnetization $M_t$ over a range of resonant frequencies. The prior art is replete with excitation techniques that are designed to take advantage of particular NMR phenomena and which overcome particular problems in the NMR measurement process.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

NMR data for constructing images can be collected using one of many available techniques. Typically, such techniques comprise a pulse sequence made up of a plurality of sequentially implemented views. Each view may include one or more NMR experiments, each of which comprises at least an RF excitation pulse and a magnetic field gradient pulse to encode spatial information into the resulting NMR signal. As is well known, the NMR signal may be a free indication decay (FID) or a spin-echo signal.

The present invention will be described in detail with reference to a variant of the well known Fourier transform (FT) imaging technique, which is frequently referred to as "spin-warp". The spin-warp technique is discussed in an article entitled "Spin Warp NMR Imaging and Applications to Human Whole-Body Imaging" by W. A. Edelstein et al., *Physics in Medicine and Biology*, Vol. 25, pp. 751–756 (1980). It employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan to produce a set of NMR data from which an entire image can be reconstructed.

There are a number of well known NMR techniques for measuring the motion, or flow of spins within the region of interest. These include the "time-of-flight" method in which a bolus of spins is excited as it flows past a specific upstream location and the state of the resulting transverse magnetization is examined at a downstream location to determine the velocity of the bolus. This method has been used for many years to measure flow in pipes, and in more recent years it has been used to measure blood flow in human limbs. Examples of this method are disclosed in U.S. Pat. Nos. 3,559,044; 3,191,119; 3,419,793 and 4,777,957.

A second flow measurement technique is the inflow/outflow method in which the spins in a single, localized volume or slice are excited and the change in the resulting transverse magnetization is examined a short time later to measure the effects of excited spins that have flowed out of the volume or slice, and the effects of differently excited spins that have flowed into the volume or slice. Examples of this method are described in U.S. Pat. Nos. 4,574,239; 4,532,474 and 4,516,582.

A third technique for measuring motion or flow relies upon the fact that an NMR signal produced by spins flowing through a magnetic field gradient experiences a phase shift which is proportional to velocity. This is referred to in the art as the "phase modulation" technique. For flow that has a roughly constant velocity during the measurement cycle the change in phase of the NMR signal is given as follows:

$$\Delta\phi = \gamma M_1 v$$

where $M_1$ is the first moment of the magnetic field gradient, $\gamma$ is the gyromagnetic ratio and $v$ is the velocity of the spins. To eliminate errors in this measurement due to phase shifts caused by other sources, it is common practice to perform the measurement at least twice with different magnetic field gradient moments as described in U.S. Pat. No. 4,609,872. The difference in phase at any location between the two measurements is then as follows:

$$\Delta\phi = \gamma \Delta M_1 v$$

By performing two complete scans with different magnetic field gradient first moments and subtracting the measured phases in the reconstructed image at each location in the acquired data arrays, a phase map is produced which accurately measures the velocity of constantly moving spins.

Magnetic resonance angiograms are produced by acquiring and calculating the phase difference between at least two NMR data sets, each with a different value for the first moment of a magnetic field gradient. The phase is substantially the same in the two data sets at locations where the spins are stationary and such tissues appear dark in the reconstructed image. On the other hand, moving spins impart a phase to the acquired NMR signal which is proportional to velocity and the value of the first moment of the magnetic field gradient. Since the first moments are different in the two acquired NMR data sets, moving spins will produce a phase difference and the locations where these phase differences occur will appear bright in the angiogram image.

There are a number of methods currently used to produce phase difference angiogram data from two or more acquired NMR data sets. In one method, which is referred to as the "phase difference method" the difference in phase between corresponding elements in the acquired NMR images is calculated and this phase difference is used to control the intensity of the corresponding image pixel. In a second method, which is referred to as the "complex difference method", the in-phase and quadrature components of corresponding elements in two acquired NMR raw data sets are subtracted to produce complex difference data which is then Fourier transformed into the image domain. Alternatively and equivalently, the two raw NMR data sets can be Fourier transformed, and the in-phase and quadrature components in corresponding image elements can be subtracted. In any case, the complex difference image is used to reconstruct the angiogram image. There are subtle differences between the angiograms produced by the phase difference and complex difference methods which make them both uniquely useful in clinical applications.

The accurate reconstruction of a magnetic resonance angiogram using either of these processing methods assumes that there are no phase errors in the measurements. While there are many sources of phase errors, most phase errors are the same in the two acquired data sets and are subtracted out of the image data by the difference process. However, some phase errors may be different in the two acquired data sets and the difference process used to produce an angiogram will produce artifacts in the reconstructed image.

There are a number of methods known for correcting phase errors in NMR measurements. For example, Juwhan Liu et al describe a phase correction technique in the *Journal of Magnetic Resonance*, Vol. 86 pp 593–604 (1990) in an article entitled "An Automatic Phase Correction Method In Nuclear Magnetic Resonance Imaging" which reduce errors due to such system hardware problems as (a) misadjustment of the reference phase relative to the receiver phase detector; (b) phase shifts caused by noise filters; (c) incorrect alignment of data acquisition window; (d) imperfect selective RF excitation pulses; (e) amplifier dead time; and (f) eddy currents. Other phase correction methods are described by C. B. Ahn et al in an article in *IEEE Transactions On Medical Imaging*, Vol M1-6 No. 1, March 1987 entitled "A New Phase Correction Method In NMR Imaging Based On Autocorrelation And Histogram Analysis"; and by M. A. Bernstein et al in an article in *Medical Physics*, Vol. 16 No. 5, Sept/Oct 1989 entitled "Improved Detectability In Low Signal-To-Noise Ratio Magnetic resonance Images By Means Of A Phase-Corrected Real Reconstruction". None of these techniques have been employed to correct angiograms produced by the complex difference method.

SUMMARY OF THE INVENTION

The present invention relates to a method and apparatus for producing NMR angiograms using the image domain complex difference method and for reducing image artifacts in such angiograms due to system phase errors. More particularly, the present invention includes the acquisition of a plurality of NMR k-space data sets using pulse sequences with different magnetic field gradient first moments, Fourier transforming the plurality of k-space data sets to produce a corresponding plurality of image space data sets; calculating the angle between the vector represented by each element in one image space data set and the vector represented by each corresponding element in another of said image space data sets and storing the angles as corresponding elements in a phase difference array; calculating the values in a corrected phase difference array from the corresponding values in the phase difference array; and calculating the values in a difference data set from which an angiogram is produced using the corresponding values in each of said plurality of image space data sets and the corresponding values in the corrected phase difference array.

A general object of the invention is to correct phase errors in angiogram NMR data sets which are produced using the complex difference method. A number of methods are known for calculating the value of phase errors from phase difference NMR data. The present invention enables such phase errors to be calculated, and provides a method for applying corrections based on these phase error calculations to the image domain complex difference data used to produce the angiogram.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
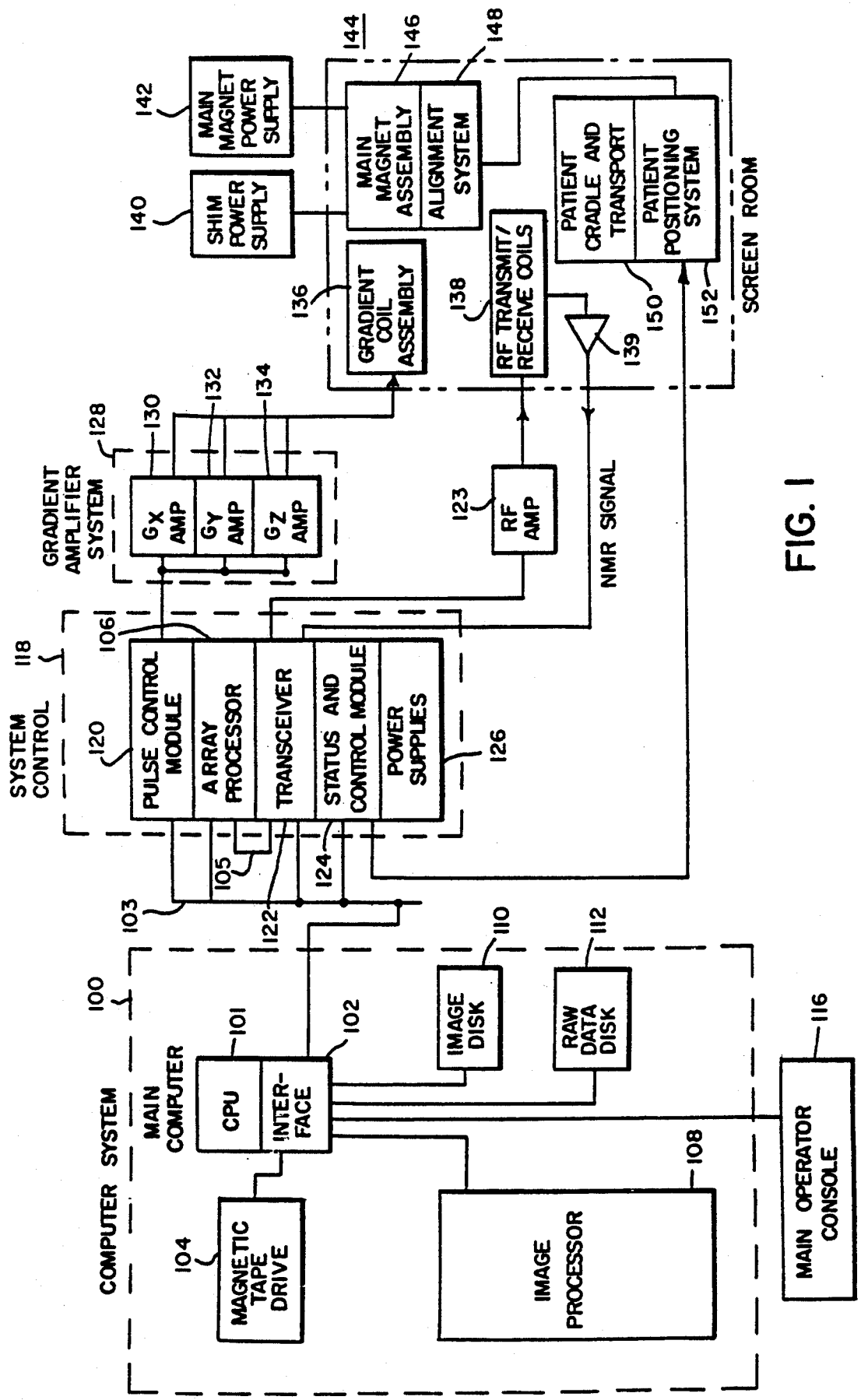
FIG. 1 is a block diagram of an NMR system which employs the present invention.

Referring first to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (such as a Data General MV7800). The computer has associated therewith an interface 102 through which a plurality of computer peripheral devices and other NMR system components are coupled. Among the computer peripheral devices is a magnetic tape drive 104 which may be utilized under the direction of the main computer for archiving patient data and images to tape. Processed patient data may also be stored in an image disc storage device designated 110. The function of image processor 108 is to provide interactive image display manipulation such as magnification, image comparison, gray-scale adjustment and real-time data display. The computer system is provided with a means to store raw data (i.e. before image construction) utilizing a disc data storage system designated 112. An operator console 116 is also coupled to the computer by means of interface 102 and provides the operator with the means to input data pertinent to a patient study as well as additional data necessary for proper NMR system operation, such as calibrating, initiating and terminating scans. The operator console is also used to display images stored on discs or magnetic tape.

The computer system 100 exercises control over the NMR system by means of system control 118 and gradient amplifier system 128. The computer 100 communicates with system control 118 by means of a link 103 in a manner well known to those skilled in the art. The system control 118 includes several subsystems such as a pulse control module (PCM) 120, an array processor 106, a radio frequency transceiver 122, a status and control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 generally comprised of $G_x$, $G_y$ and $G_z$ amplifiers 130, 132 and 134, respectively. Each amplifier 130, 132 and 134 is utilized to excite a corresponding gradient coil in an assembly generally designated 136. When energized, the gradient coils generate magnetic field gradients $G_x$, $G_y$ and $G_z$ of the magnetic field in the same direction as the main polarizing magnetic field, wherein the gradients are directed in mutually orthogonal X-, Y- and Z-axis directions of a Cartesian coordinate system. That is, if the magnetic field generated by the main magnet (not shown) is directed in the z direction and is termed $B_0$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x, y, z) is given by $B(x, y, z) = B_0 + G_x x + G_y y + G_z z$.

The gradient magnetic fields are utilized in combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform modulated in accordance with the control signals to an RF power amplifier 123 which then energizes RF coil 138 which is situated within main magnet assembly 146. The NMR signals radiated by the excited nuclei in the patient are sensed by the same or a different RF coil than is used for transmitting and amplified by a preamplifier 139. The NMR signals are amplified, demodulated, filtered, and digitized in the receiver section of the transceiver 122. The processed NMR signals are transmitted to the array processor 106 for processing by means of a dedicated, unidirectional link 105.

The PCM 120 and SCM 124 are independent subsystems both of which communicate with main computer 101, peripheral system, such as patient positioning system 152, as well as to one another by means of serial communications link 103. The PCM 120 and SCM 124 are each comprised of a 16-bit microprocessor (such as Intel 80286) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148. A shim power supply 140 is utilized to energize shim coil associated with the main magnet and which are used to correct inhomogeneities in the polarizing magnet field. In the case of a resistive magnet, main magnet power supply 142 is utilized to continuously energize the magnet. In the case of a superconductive magnet, the main power supply 142 is utilized to bring the polarizing field produced by the magnet to the proper operating strength and is then disconnected. In the case of a permanent magnet, power supply 142 would not be needed. The patient alignment system 148 operates in combination with a patient cradle and transport system 150 and patient positioning system 152. To minimize interference from external sources, the NMR system components comprised of the main magnet assembly, the gradient coil assembly, and the RF transmit and receiver coils, as well as the patient-handling devices, are enclosed in an RF-shielded room generally designated 144.

Figure 2:
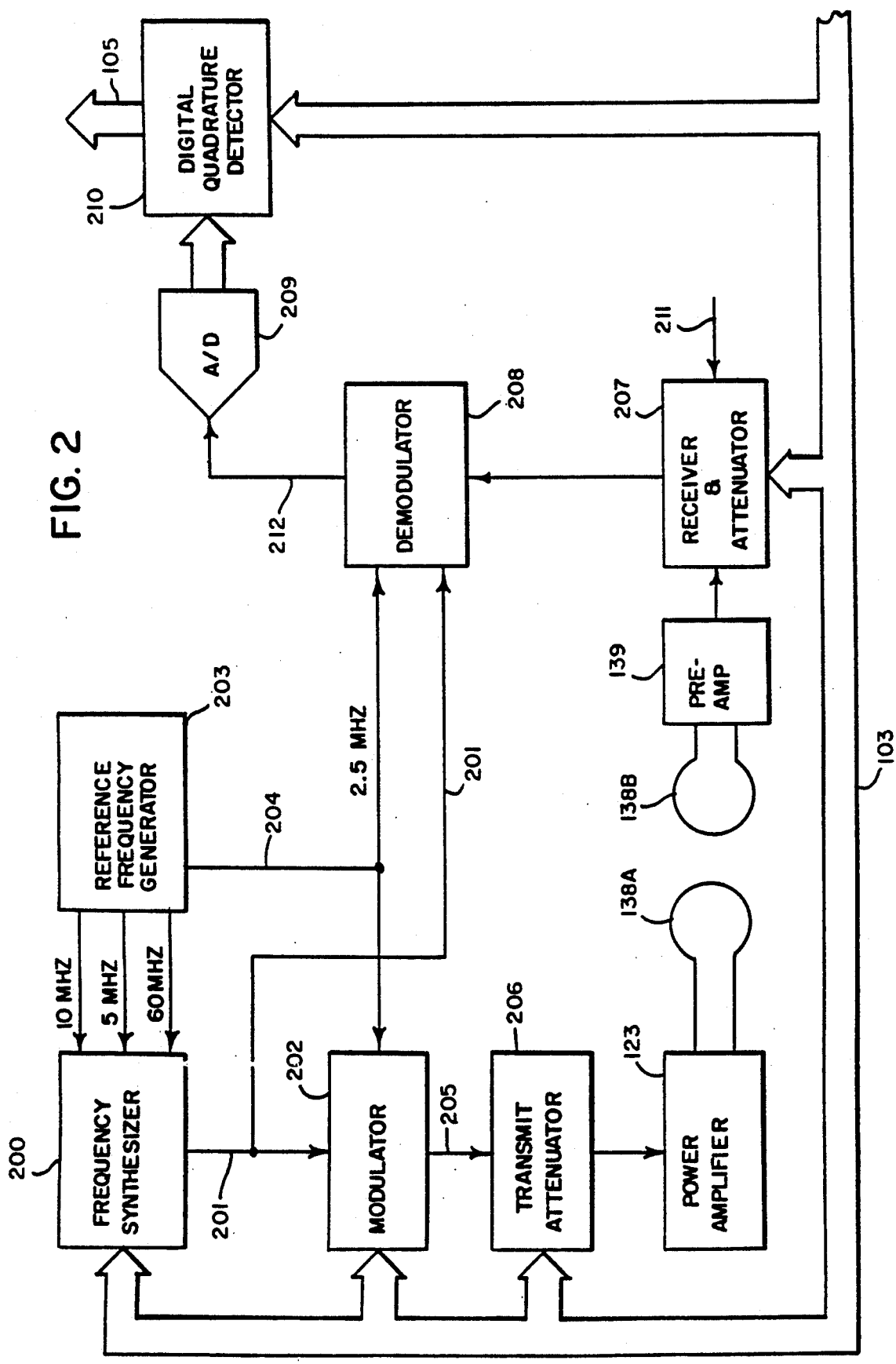
FIG. 2 is an electrical block diagram of the transceiver which forms part of the NMR system of FIG. 1.

Referring particularly to FIGS. 1 and 2, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced under control of a frequency synthesizer 200 which receives a set of digital signals through the communications link 103 from the main computer 101. These digital signals indicate the frequency and phase of the RF carrier signal which is produced at an output 201. The commanded RF Carrier is applied to a modulator 202 where it is modulated in response to a signal R(t) received through bus 103 from the PCM 120. The signal R(t) defines the envelope, and therefore the bandwidth, of the RF excitation pulse to be produced. It is produced in the PCM 120 by sequentially reading out a series of stored digital values as the RF excitation pulse is produced that represent the desired envelope. These stored digital values may, in turn, be changed by the computer 100 to enable any desired RF pulse envelope to be produced. The magnitude of the RF excitation pulse output through line 205 is attenuated by a transmit attenuator circuit 206 which receives a digital signal, TA, from the main computer 101 through communications link 103. The attenuated RF excitation pulses are applied to the power amplifier 123 that drives the RF transmitter coil 138A. For a more detailed description of this portion of the transceiver 122, reference is made to U.S. Pat. No. 4,952,877 which is incorporated herein by reference.

Referring still to FIGS. 1 and 2 the NMR signal produced by the subject is picked up by the receiver coil 138B and applied to the input of a receiver 207. The receiver 207 amplifies the NMR signal and this is attenuated by an amount determined by a digital attenuation signal (RA) received from the main computer 101 through link 103. The receiver 207 is also turned on and off by a signal through line 211 from the PCM 120 such that the NMR signal is acquired only over the time intervals required by the particular acquisition being performed.

The received NMR signal is at or around the Larmor frequency, which in the preferred embodiment is around 63.86 MHz. This high frequency signal is demodulated in a two step process in a demodulator 208 which first mixes the NMR signal with the carrier signal on line 201 and then mixes the resulting signal with the 2.5 MHz reference signal on line 204. The resulting demodulated NMR signal on line 212 has a bandwidth of 125 kHz and it is centered at a frequency of 187.5 kHz. The demodulated NMR signal is applied to the input of an analog-to-digital (A/D) converter 209 which samples and digitizes the analog signal at a rate of 250 kHz. The output of the A/D converter 209 is applied to a digital quadrature detector 210 which produces 16-bit in-phase (I) values and 16-bit quadrature (Q) values corresponding to the received digital signal. The resulting stream of digitized I and Q values of the received NMR signal is output through bus 105 to the array processor where they are employed to reconstruct an image.

To preserve the phase information contained in the received NMR signal, both the modulator 202 in the transmitter section and the demodulator 208 in the receiver section are operated with common signals. More particularly, the carrier signal at the output 201 of the frequency synthesizer 200 and the 2.5 MHz reference signal at the output 204 of the reference frequency generator 203 are employed in both the modulation and the demodulation process. Phase consistency is thus maintained and phase changes in the demodulated received NMR signal accurately indicate phase changes produced by the excited spins. The 2.5 MHz reference signal as well as 5, 10 and 60 MHz reference signals are produced by the reference frequency generator 203 from a common 10 MHz clock signal, and the latter three reference signals are employed by the frequency synthesizer 200 to produce the carrier signal on output 201. For a more detailed description of the receiver, reference is made to U.S. Pat. No. 4,992,736 which is incorporated herein by reference.

Figure 3A:
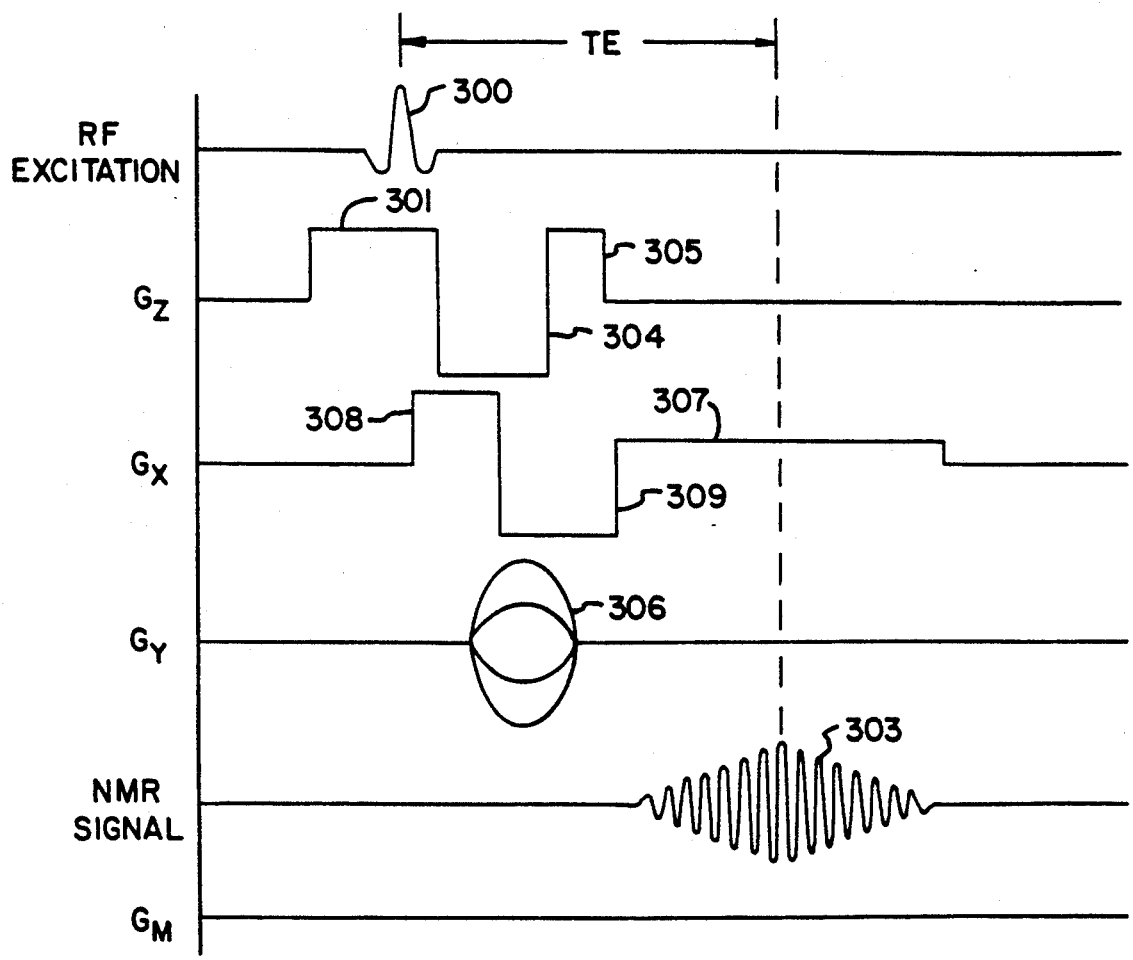
FIGS. 3A–3C are graphic representations of the NMR pulse sequences used in the preferred embodiments to acquire the NMR data sets employed to reconstruct an angiogram according to the present invention.

The NMR system of FIG. 1 performs a series of pulse sequences to collect sufficient NMR data to reconstruct the desired angiogram. Referring particularly to FIG. 3A, the first pulse sequence is a conventional first order moment nulled gradient echo sequence in which a selective RF excitation pulse 300 is applied to the subject in the presence of a $G_z$ slice select gradient pulse 301. The excitation pulse 300 has a flip angle $\alpha$ with a typical value of $\alpha$ being 30°. To compensate the FID for the phase shifts caused by the slice select gradient pulse 301 and to desensitize the FID to velocity along the z axis, a negative $G_z$ gradient pulse 304 followed by a positive $G_z$ gradient pulse 305 are produced by the $G_z$ gradient coils. For example, one solution is to use a pulse 304 of the same width, but opposite sign, as the pulse 301, and the pulse 305 is one half the width and the same height as the pulse 301. While the pulses 304 and 305 compensate for velocity along the z axis, more complex gradient waveforms are also well known to those skilled in the art for compensating acceleration and even higher orders of motion.

To position encode the NMR signal 303 a phase encoding $G_y$ gradient pulse 306 is applied to the subject shortly after the application of the RF excitation pulse 300. As is well known in the art, a complete scan is comprised of a series of these pulse sequences in which the value of the $G_y$ phase encoding pulse is stepped through a series of, for example, 256 discrete phase encoding values to locate the position of the spins producing the NMR signal along the y axis. Position along the x axis is located by a $G_x$ gradient pulse 307 which is produced as the NMR gradient echo signal 303 is acquired and which frequency encodes the NMR signal 303. Unlike the $G_y$ phase encoding gradient pulse 306, the $G_x$ readout gradient pulse 307 remains at a constant value during the entire scan. To produce the gradient echo 303 and to desensitize it to velocity along the x axis, gradient pulses 308 and 309 are produced prior to the pulse 307. There are a number of well known strategies to accomplish this.

As is explained in more detail below, to practice the present invention, at least two complete data sets, each with different flow sensitivity along one direction, are needed. In the preferred embodiment data for the sets is acquired in an interleaved fashion. In this approach, two or more measurements with different flow sensitivity are acquired with one value of the phase encoding gradient. The phase encoding value is then changed and additional measurements are made at this new phase encoding value with the two or more flow sensitivities. This process continues until all the phase encoding values have been employed. The acquired data is then reordered into k-space NMR data sets, each with a different flow sensitivity. While this interleaved approach is preferred because it minimizes effects due to other motion (e.g. respiratory), in the following discussion the invention is described as if the k-space NMR data sets are each completely acquired prior to the next flow encoding being used.

The NMR signal 303 is acquired by the system transceiver 122 and digitized into a row of 256 complex numbers which are stored in the memory of the main computer 101. For each value of the $G_y$ phase encoding gradient an NMR signal 303 is produced, acquired, digitized and stored in a separate row of 256 complex numbers. At the completion of the scan, therefore, a two-dimensional (256×256) matrix of complex numbers is stored in the computer 101. If these NMR signals are produced when no flow sensitizing gradients are applied, the k-space NMR data set may be Fourier transformed into a conventional NMR image. This is represented in FIG. 3A by the gradient $G_M$ which is zero when no velocity encoding magnetic field gradient first moment is employed in the pulse sequence.

Figure 3B:
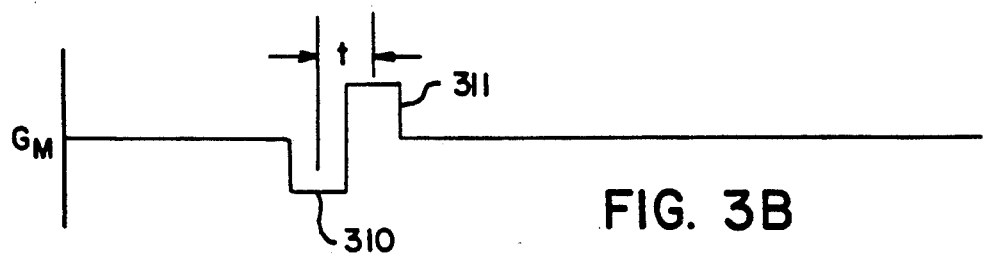

To produce an angiogram according to the present invention the acquired NMR signals are velocity sensitized. The pulse sequence used is the same as that shown in FIG. 3A, except the gradient $G_M$ now has a value which sensitizes the acquired NMR signals to velocity along the direction of $G_M$. This is illustrated in FIG. 3B, where $G_M$ has a bipolar waveform comprised of a negative gradient pulse 310 followed by a positive gradient pulse 311. The area (A) defined by each pulse 310 and 311 is the same, and the centers of each gradient pulse 310 and 311 are spaced from one another by a time interval (t). The incremental first moment ($\Delta M_1$) provided by the $G_M$ gradient is, therefore $\Delta M_1 = A \times t$, and this gradient first moment $\Delta M_1$ is applied after the application of the RF excitation pulse 300 and before the acquisition of the signal 303. While the gradient $G_m$ is illustrated as a separate gradient magnetic field, in fact, it is produced by the same coils which produce the $G_x$, $G_y$ and $G_z$ gradient fields. By combining $G_x$, $G_y$ and $G_z$ gradient fields of the proper amplitude, the gradient moment $G_M$ can be oriented in any direction in space in order to sensitize for flow in that direction. For example, it is quite common to sensitize for flow in the slice selection direction, in which case the gradient moment $G_M$ is produced solely by the $G_z$ gradient coil. Thus, in the preferred embodiment a first array of NMR raw signals $Z_1$ is acquired using the pulse sequence of FIG. 3A, but with the $G_M$ gradient field of FIG. 3B added.

Figure 3C:
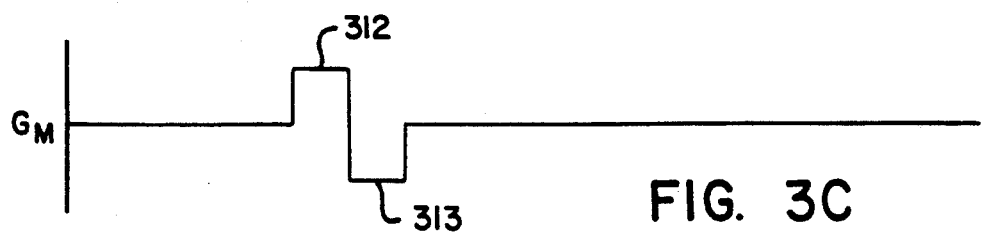

After the first array of NMR signals $Z_1$ have been acquired and stored, a second array of signals $Z_2$ are acquired. This is done during a scan in which the pulse sequence of FIG. 3A is employed, but the gradient moment $G_M$ is altered as shown in FIG. 3C to produce a moment of $-\Delta M_1$. This is accomplished with gradient pulse 312 and 313 which are identical, but opposite in direction to the gradient pulses 310 and 311. After the 256 NMR signals $Z_2$ have been acquired and stored in the computer 101, the data acquisition phase is completed for one axis of motion and the data processing phase is commenced.

It should be apparent to those skilled in the art that many variations in the data acquisition phase of the invention are possible. Other NMR pulse sequences can be employed, and as was mentioned previously, the acquisition of the k-space NMR data sets $Z_1$ and $Z_2$ can be interleaved. Also, multiple sequences may be conducted at each phase encoding gradient $G_y$ in order to improve signal-to-noise or to cancel system errors as described in U.S. Pat. No. 4,443,760. There are also many different ways to produce the gradient moment $\Delta M_1$ using the gradient $G_M$. For example, the gradient pulses 310–313 can be shaped differently, or they may be separated in time to increase the first moment $\Delta M_1$. Also, it is possible to employ spin echo sequences which use 180° RF pulses to refocus the undesirable effects of static magnetic field inhomogeneities. If 180° pulses are used, as is known to those skilled in the art, the first moment can be produced by gradient lobes of the same polarity placed on opposite sides of the 180° RF pulse.

In one preferred embodiment of the invention three pairs of k-space NMR data sets are acquired as described above. The first pair ($Z_1(x)$ and $Z_2(x)$) have a gradient first moment $G_M$ directed along the x axis, the second pair ($Z_1(y)$ $Z_2(y)$) have a gradient first moment $G_M$ directed along the y axis, and and the third pair ($Z_1(z)$ and $Z_2(z)$) have a gradient first moment $G_M$ directed along the z axis. As will be explained below, these pairs of k-space NMR data sets are processed separately according to the present invention and the results are then combined to form an angiogram which is sensitive to spins moving in any direction.

While a six point method for measuring the velocity of spins is described above, the present invention is also compatible with the simple four point method of three-dimensional flow measurement. In such case, the three data sets $Z_2(x)$, $Z_2(y)$ and $Z_2(z)$ are replaced by a single data set $Z_2(ref)$ which is produced using a flow compensated pulse sequence that is insensitive to motion along any axis. Both the six point and the balanced four point methods are described in our article in *Society of Magnetic Resonance in Medicine*, Ninth Annual Meeting, Abstract No. 475 (1990) entitled "Optimized Encoding For Phase Contrast Flow Measurement."

Figure 4:
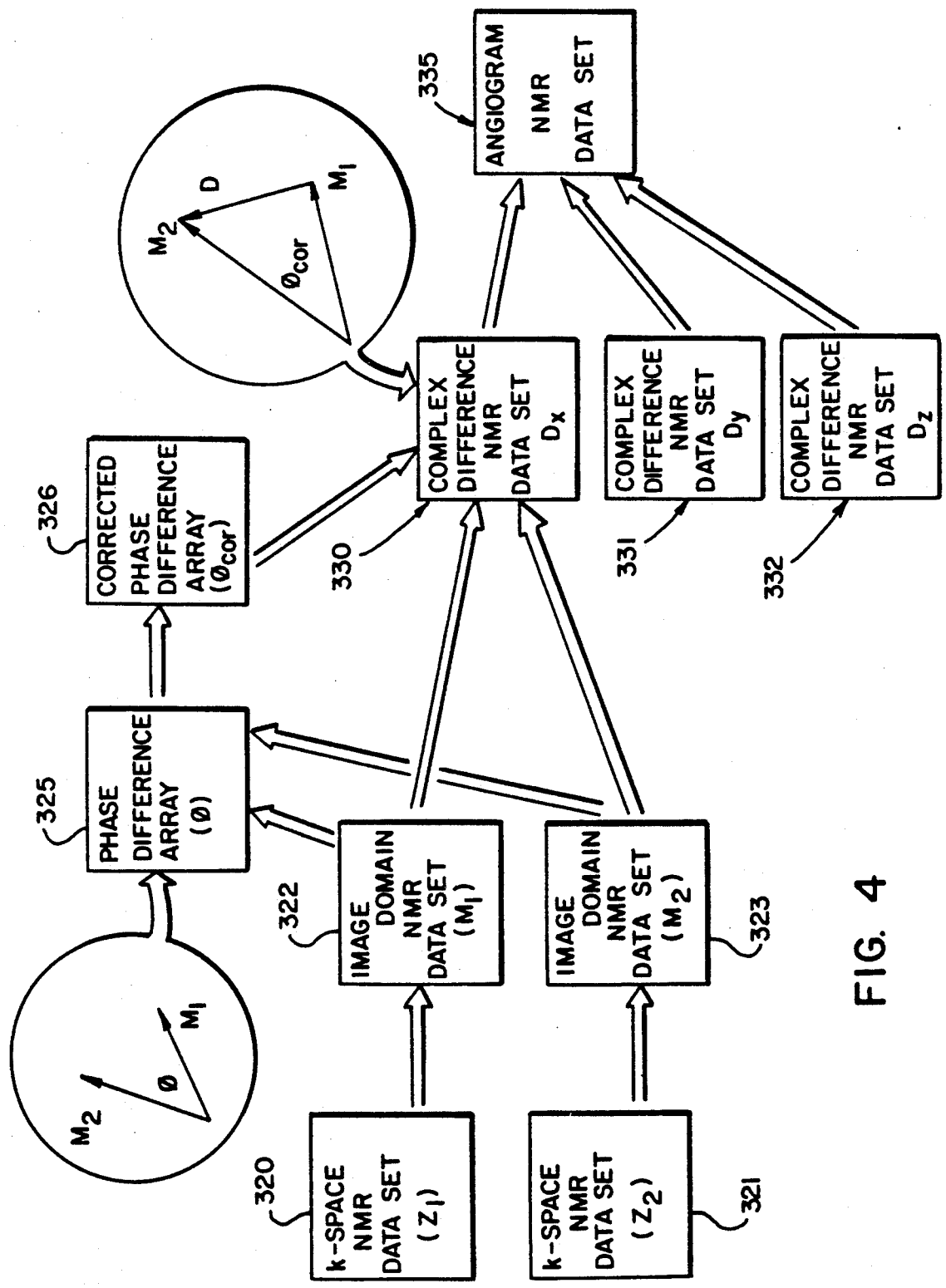
FIG. 4 is an pictorial representation of how an angiogram is reconstructed using the NMR data sets acquired with the system of FIG. 1 using the pulse sequence of FIG. 3.

The processing of the k-space NMR data sets $Z_1$ and $Z_2$ to produce an angiogram is illustrated in FIG. 4. All of the processing is carried out in the main computer 101 under the direction of instructions in a stored program. The two k-space NMR data sets $Z_1$ and $Z_2$ are stored as 256 by 256 arrays of complex numbers indicated by blocks 320 and 321. The first step in the process is to perform a two-dimensional, complex Fourier transformation on each of these data sets 320 and 321 to transform the images they represent from k-space to the image domain. This is the same transformation used to produce conventional NMR images and the results are two 256 by 256 element arrays 322 and 323 of complex numbers ($M_1$) and ($M_2$). The magnitudes of the complex numbers $M_1(x,y)$ and $M_2(x,y)$ indicate the spin density at corresponding image pixel locations (x,y) and the phase of each complex number $M_1(x,y)$ and $M_2(x,y)$ is determined by both the velocity of the spins along the direction of the motion encoding magnetic field gradient $G_M$ and by any system phase errors. Any difference in these system phase errors in the two data sets produce image artifacts when a conventional complex-difference angiogram is produced using the image domain NMR data sets $M_1$ and $M_2$, and it is these phase errors which are substantially reduced by employing the teachings of the present invention.

Referring still to FIG. 4, phase corrections are calculated from the image domain NMR data sets 322 and 323. More specifically, a 256 by 256 element phase difference array 325 is calculated from the two transformed NMR data sets $M_1$ and $M_2$. Each element ($\phi$) of the phase difference array 325 is calculated from the corresponding $I_1$, $Q_1$ and $I_2$, $Q_2$ elements of the respective data sets 322 and 323 as follows:

$$\phi = \tan^{-1} Q_1/I_1 - \tan^{-1} Q_2/I_2; \text{ or}$$
$$\phi = \tan^{-1} [(I_2 Q_1 - I_1 Q_2)/(I_1 I_2 + Q_1 Q_2)]$$

where:
$$M_1 = I_1 + iQ_1$$
$$|M_1| = \sqrt{I_1^2 + Q_1^2}$$
$$M_2 = I_2 + iQ_2$$
$$|M_2| = \sqrt{I_2^2 + Q_2^2}$$

The $\phi$ values above are preferably computed using a four quadrant arctangent.

Each element ($\phi$) in the phase difference array 325 is then corrected to produce a corresponding element ($\phi_{cor}$) in a 256 by 256 element corrected phase difference array 326. The phase correction can be modeled as the sum of a constant and two linear components:

$$\phi_{cor} = \phi - (\phi_0 + \alpha x + \beta y) \quad (1)$$

Where x and y are position in the two imaging coordinates. While the method described herein is general enough to be compatible with nearly any phase correction method, in the preferred embodiment $\phi_1$, $\alpha$ and $\beta$ are calculated using a least squares fit. It has been found that weighting the least square fit by the square of the average magnitude $(A=(|M_1|+|M_2|)/2)$ provides adequate suppression of regions of low signal. Thus, the least squares fit for $\phi_0$, $\alpha$ and $\beta$ is:

$$\phi_0 = \frac{\begin{vmatrix} \Sigma A^2 \phi & \Sigma A^2 x & \Sigma A^2 y \\ \Sigma A^2 \phi x & \Sigma A^2 x^2 & \Sigma A^2 xy \\ \Sigma A^2 \phi y & \Sigma A^2 xy & \Sigma A^2 y^2 \end{vmatrix}}{\begin{vmatrix} \Sigma A^2 & \Sigma A^2 x & \Sigma A^2 y \\ \Sigma A^2 x & \Sigma A^2 x^2 & \Sigma A^2 xy \\ \Sigma A^2 y & \Sigma A^2 xy & \Sigma A^2 y^2 \end{vmatrix}}$$

$$\alpha = \frac{\begin{vmatrix} \Sigma A^2 & \Sigma A^2 \phi & \Sigma A^2 y \\ \Sigma A^2 x & \Sigma A^2 \phi x & \Sigma A^2 xy \\ \Sigma A^2 y & \Sigma A^2 \phi y & \Sigma A^2 y^2 \end{vmatrix}}{\begin{vmatrix} \Sigma A^2 & \Sigma A^2 x & \Sigma A^2 y \\ \Sigma A^2 x & \Sigma A^2 x^2 & \Sigma A^2 xy \\ \Sigma A^2 y & \Sigma A^2 xy & \Sigma A^2 y^2 \end{vmatrix}}$$

$$\beta = \frac{\begin{vmatrix} \Sigma A^2 & \Sigma A^2 x & \Sigma A^2 \phi \\ \Sigma A^2 x & \Sigma A^2 x^2 & \Sigma A^2 \phi x \\ \Sigma A^2 y & \Sigma A^2 xy & \Sigma A^2 \phi y \end{vmatrix}}{\begin{vmatrix} \Sigma A^2 & \Sigma A^2 x & \Sigma A^2 y \\ \Sigma A^2 x & \Sigma A^2 x^2 & \Sigma A^2 xy \\ \Sigma A^2 y & \Sigma A^2 xy & \Sigma A^2 y^2 \end{vmatrix}}$$

The summations in the above equations are over all pixel values in the image array. The corrected phase $\phi_{cor}$ is thus calculated for each position x, y in the array 326 using Eq. 1, where $\phi_0$, $\alpha$, and $\beta$ were calculated using the average magnitude values (A) and the phase difference values $\phi$ from the array 325. One important advantage of performing the phase correction on the phase image is that the correction can easily be extended to orders higher than linear.

A complex difference NMR data set is now calculated using the image domain NMR data sets 322 and 323, and the corrected phase difference array 326. This is accomplished by calculating each of 256 by 256 elements (D) in a complex difference data set 330 using the corresponding elements $M_1$, $M_2$ and $\phi_{cor}$ in the respective arrays 322, 323 and 326 and the following formula:

$$D_x = \sqrt{|M_1|^2 + |M_2|^2 - 2|M_1||M_2|\cos \phi_{cor}}$$

In other words, the magnitude data in the image domain NMR data sets 322 and 323 is used, but the phase difference information is not used. Instead, the corrected phase difference data $\phi_{cor}$ in the array 326 is employed so that artifacts produced by phase errors are eliminated from the resulting angiogram.

If motion in all directions was encoded, the above procedure is repeated for each axis of motion (x,y and z) to produce two more 256 by 256 element complex difference NMR data sets 331 and 332. The difference information in the arrays 330-332 thus indicate the complex differences $D_x$, $D_y$ and $D_z$ attributable to the motion of spins along the respective x, y and z axis. These are combined to produce a 256 by 256 element angiogram NMR data set 335 in accordance with the following formula:

$$D = \sqrt{(D_x)^2 + (D_y)^2 + (D_z)^2}$$

The angiogram NMR data set 335 may be used to produce a display in which moving spins are brighter than stationary spins. Since the motion of blood through the cardiovascular system is the predominant motion, the angiogram is essentially an image of the cardiovascular tree that is within the field of view.

We claim:

1. An NMR system for producing an angiogram with reduced sensitivity to unwanted phase shifts, the combination comprising:

means for applying a polarizing magnetic field to a region of interest;

means for applying a magnetic field gradient to the region of interest;

means for applying an RF excitation field to the region of interest;

means for acquiring an NMR signal produced by excited spins in the region of interest;

means for executing a first scan in which a first motion encoding magnetic field gradient is employed and in which the acquired NMR signals are stored as a first k-space NMR data set ($Z_1$);

means for executing a second scan in which a second motion encoding magnetic field gradient is employed and in which the acquired NMR signals are stored as a second k-space NMR data set ($Z_2$);

means for producing a corrected complex difference NMR data set from the k-space NMR data sets ($Z_1$) and ($Z_2$)
   which includes:

a) means for producing a first image domain NMR data set ($M_1$) by performing a Fourier transformation on the first k-space NMR data set ($Z_1$);

b) means for producing a second image domain NMR data set ($M_2$) by performing a Fourier transformation on the second k-space NMR data set ($Z_2$);

c) means for calculation a phase difference array ($\phi$) in which the value of each element therein is calculated from the values of corresponding elements in the first and second image domain NMR data sets ($M_1$) and ($M_2$);

d) means for calculating a corrected phase difference array ($\phi_{cor}$) in which the value of each element therein is calculated from the value of the corresponding element in the phase difference array ($\phi$);

e) means for calculating the complex difference NMR data set in which each element therein (D) is calculated from corresponding elements in the first and second image domain NMR data sets $M_1$ and $M_2$ and the corrected phase difference array ($\phi_{cor}$) in accordance with the following expression:

$$D = \sqrt{|M_1|^2 + |M_2|^2 - 2|M_1|\,|M_2|\cos\phi_{cor}}\,;$$

means for producing an image in which the brightness of the pixels therein are determined by the values in the complex difference NMR data set.

2. The NMR system as recited in claim 1 in which the first and second motion encoding magnetic field gradients are applied separately along each of three axes of motion and the NMR system includes means for calculating a complex difference NMR data set ($D_x$), ($D_y$) and ($D_z$) for each of said three axes of motion, and the means for producing the image combines the data from corresponding elements of the three complex difference NMR data sets ($D_x$), ($D_y$) and ($D_z$) to determine the brightness of the image pixels.

* * * * *